US012622096B2

(12) United States Patent
Li et al.

(10) Patent No.: US 12,622,096 B2
(45) Date of Patent: May 5, 2026

(54) DISPLAY PANEL AND PREPARATION METHOD THEREOF

(71) Applicant: HKC CORPORATION LIMITED, Shenzhen (CN)

(72) Inventors: Zeyao Li, Shenzhen (CN); Haoxuan Zheng, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 456 days.

(21) Appl. No.: 18/386,274

(22) Filed: Nov. 2, 2023

(65) Prior Publication Data

US 2024/0072201 A1      Feb. 29, 2024

Related U.S. Application Data

(63) Continuation of application No. PCT/CN2022/142465, filed on Dec. 27, 2022.

(30) Foreign Application Priority Data

Jul. 29, 2022      (CN) .......................... 202210910571.3

(51) Int. Cl.
H10H 20/812            (2025.01)
H10H 20/819            (2025.01)
(Continued)

(52) U.S. Cl.
CPC ........ H10H 20/812 (2025.01); H10H 20/819 (2025.01); H10H 20/8314 (2025.01);
(Continued)

(58) Field of Classification Search
CPC ............. H10H 20/0361; H10H 20/812; H10H 20/819; H10H 20/8314; H10H 20/8511;
(Continued)

(56) References Cited

U.S. PATENT DOCUMENTS

2015/0294993 A1      10/2015   Kim et al.
2017/0336690 A1      11/2017   Lee et al.
(Continued)

FOREIGN PATENT DOCUMENTS

CN            101166394 A        4/2008
CN            104600079 A        5/2015
(Continued)

OTHER PUBLICATIONS

Korean Request for the Submission of an Opinion , Korean Application No. 10-2024-7020003, mailed Jun. 30, 2025 (10 pages).
(Continued)

*Primary Examiner* — Monica D Harrison

(57) ABSTRACT

The present application provides a display panel and a method for making the display panel. The display panel includes a substrate, a driving circuit layer, multiple light emitting units, and a black matrix layer. The black matrix layer is located between two adjacent light emitting units. The multiple light emitting units are staggered with driving elements, common electrodes and signal lines. A light emitting element emits light towards a quantum dot layer, thereby exciting the quantum dot layer to emit light. The embodiments of the present application provide a full-color display panel emitting light towards the substrate, and improve electrodes of the driving transistor and/or electrodes of the switching transistor.

20 Claims, 4 Drawing Sheets

(51) Int. Cl.

| | |
|---|---|
| *H10H 20/831* | (2025.01) |
| *H10H 20/851* | (2025.01) |
| *H10H 29/14* | (2025.01) |
| *H10H 20/01* | (2025.01) |

(52) U.S. Cl.
CPC ...... *H10H 20/8511* (2025.01); *H10H 29/142* (2025.01); *H10H 20/0361* (2025.01)

(58) Field of Classification Search
CPC .............. H10H 29/142; H10H 29/012; H10H 29/8512; H10H 29/8514; H10H 29/8552; H10H 29/39; H10H 20/851; H10H 20/857; H10D 86/441; H10D 86/451; H10D 86/60; H10D 86/021; H10W 90/00
USPC .......................................................... 257/79
See application file for complete search history.

(56) References Cited

U.S. PATENT DOCUMENTS

| | | | |
|---|---|---|---|
| 2018/0122837 A1 | 5/2018 | Kang et al. | |
| 2021/0091275 A1 | 3/2021 | Chen et al. | |
| 2021/0366378 A1 | 11/2021 | Zhao et al. | |
| 2022/0149113 A1 | 5/2022 | Akimoto | |
| 2023/0138392 A1* | 5/2023 | Shin .................... | H10K 59/873 |
| | | | 257/40 |

FOREIGN PATENT DOCUMENTS

| | | | |
|---|---|---|---|
| CN | 109616497 | A | 4/2019 |
| CN | 111048568 | A | 4/2020 |
| CN | 111725324 | A | 9/2020 |
| CN | 111769108 | A | 10/2020 |
| CN | 111863837 | A | 10/2020 |
| CN | 113593424 | A | 11/2021 |
| CN | 113641041 | A | 11/2021 |
| CN | 108269823 | B | 1/2022 |
| CN | 114267684 | A | 4/2022 |
| CN | 114495734 | A | 5/2022 |
| CN | 115000098 | A | 9/2022 |
| JP | 2009503572 | A | 1/2009 |
| WO | 2022005005 | A1 | 1/2022 |

OTHER PUBLICATIONS

Japanese First Notice of Reasons for Refusal, Japanese Patent Application No. 2024-555006, mailed Sep. 9, 2025 (12 pages).
European Search Report, European Application No. 22952940.9, mailed Nov. 3, 2025 (10 pages).
Chinese First Office Action,Chinese Application No. 202210910571.3, mailed Sep. 15, 2022 (17 pages).
Chinese second Office Action,Chinese Application No. 202210910571.3, mailed Sep. 29, 2022 (9 pages).
Notification to Grant Patent Right for Invention, Chinese Application No. 202210910571.3, mailed Oct. 9, 2022 (6 pages).
International Search Report, International Application No. PCT/CN2022/142465, mailed Apr. 20, 2023 (18 pages).

* cited by examiner

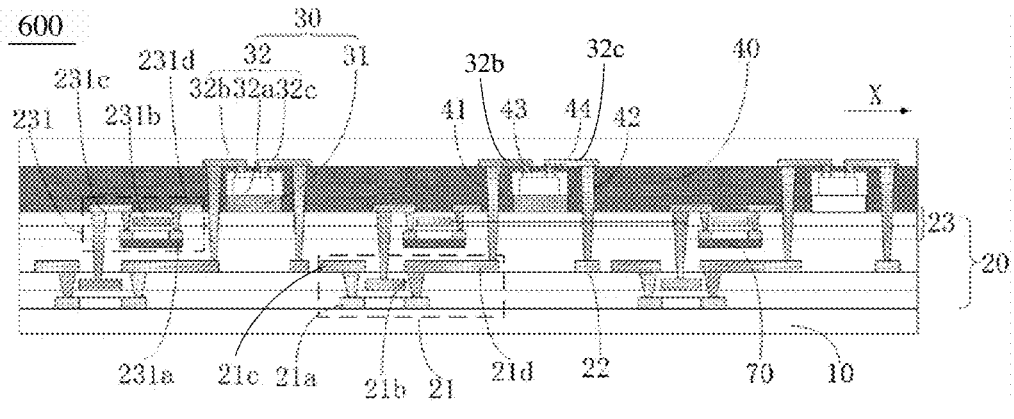

FIG. 9 forming the driving circuit layer on the substrate, wherein the driving circuit layer includes the plurality of driving elements, the plurality of common electrodes, and the plurality of signal lines ⌐S1 disposing a light emitting unit layer on the side of the driving circuit layer away from the substrate, wherein the light emitting unit layer includes the plurality of light emitting units disposed in the array form, and the black matrix layer; and the plurality of light emitting units is disposed staggered with the plurality of driving elements, the plurality of common electrodes, and the plurality of signal lines ⌐S2

FIG. 10

DISPLAY PANEL AND PREPARATION METHOD THEREOF

CROSS-REFERENCE TO RELATED APPLICATIONS

The present application is a continuation of International (PCT) Patent Application No. PCT/CN2022/142465 filed on Dec. 27, 2022, which claims priority to Chinese Patent Application No. 202210910571.3, filed on Jul. 29, 2022, the contents of all of which are hereby incorporated by reference in its entirety.

TECHNICAL FIELD

The present disclosure relates to the technology field of displays, and in particular to a display panel and a method for making the display panel.

BACKGROUND

Inorganic micro light emitting diode (Micro LED) displays are one of the hotspots in the research field of displays nowadays. Compared with OLED displays, the Micro LEDs have the advantages of high reliability, low power consumption, high brightness, fast response speed, and the like. In the preparation of the Micro LED displays, realizing full-color display of inorganic Micro LED displays has always been an important and urgent research direction.

SUMMARY OF THE DISCLOSURE

A technical solution adopted by the present disclosure is providing a display panel, and the display panel includes a substrate, a driving circuit layer, a plurality of light emitting units, and a black matrix layer.

The driving circuit layer is disposed on a side of the substrate. The driving circuit layer includes a plurality of driving elements, a plurality of common electrodes, and a plurality of signal lines.

The plurality of light emitting units are disposed in an array and on a side of the driving circuit layer away from the substrate. Each of the plurality of light emitting units includes a quantum dot layer and a light emitting element. The light emitting element includes a light emitting layer, a first electrode, and a second electrode.

The black matrix layer is disposed on the side of the driving circuit layer away from the substrate, and between adjacent two of the plurality of light emitting units.

The plurality of light emitting units are staggered with the plurality of driving elements, the plurality of common electrodes, and the plurality of signal lines. The light emitting element is located on a side of the quantum dot layer away from the substrate. The first electrode and the second electrode are located on a side of the light emitting layer away from the substrate, the light emitting element is configured to emit light towards the quantum dot layer to excite the quantum dot layer to emit light. The black matrix layer defines a plurality of first through holes and a plurality of second through holes. Each of the plurality of first through holes extends to the driving circuit layer to expose a corresponding one of the plurality of driving elements, and each of the plurality of second through holes extends to the driving circuit layer to expose a corresponding one of the plurality of common electrodes. The first electrode is electrically connected to the corresponding one of the plurality of driving elements through a corresponding one of the plurality of first through holes, and the second electrode is electrically connected to the corresponding one of the plurality of common electrodes through a corresponding one of the plurality of second through holes.

In some embodiments, the black matrix layer and the plurality of light emitting units are directly disposed on a surface of the driving circuit layer away from the substrate. Alternatively, the display panel further includes a planarization layer disposed on the side of the driving circuit layer away from the substrate. The black matrix layer and the plurality of light emitting units are disposed on a surface of the planarization layer away from the substrate.

In some embodiments, a thickness of the black matrix layer is greater than a thickness of each of the plurality of light emitting units. The black matrix layer is configured to cover the plurality of light emitting units. The black matrix layer further defines a plurality of third through holes and a plurality of fourth through holes. Each of the plurality of third through holes is configured to expose the first electrode of the light emitting element of a corresponding one of the plurality of light emitting units. Each of the plurality of fourth through holes is configured to expose the second electrode of the light emitting element of a corresponding one of the plurality of light emitting units.

Alternatively, the thickness of the black matrix layer is less than or equal to the thickness of each of the plurality of light emitting units. The display panel further includes a first covering layer, and the first covering layer is configured to cover the black matrix layer and the plurality of light emitting units. The first covering layer defines a plurality of fifth through holes and a plurality of sixth through holes. Each of the plurality of fifth through holes is configured to expose the first electrode of the light emitting element of a corresponding one of the plurality of light emitting units. Each of the plurality of sixth through holes is configured to expose the second electrode of the light emitting element of a corresponding one of the plurality of light emitting units. The plurality of fifth through holes and the plurality of sixth through holes are configured to extend through the first covering layer.

In some embodiments, each of the plurality of driving elements includes a driving transistor disposed on the side of the substrate.

The driving transistor at least includes a first active part, a first gate electrode, a third electrode, and a fourth electrode. The third electrode and the fourth electrode are disposed on a side of the first active part away from the substrate. The third electrode and the fourth electrode are spaced apart from each other and disposed on two opposite sides of the first active part along a first direction, respectively. At least one of the third electrode and the fourth electrode is provided with a first protruding part, and the first protruding part extends to two opposite sides of the first active part along a second direction perpendicular to the first direction, and is configured to block light emitted by the light emitting element from irradiating the first active part.

In some embodiments, each of the third electrode and the fourth electrode is provided with the first protruding part. The first protruding part of the third electrode is staggered with the first protruding part of the fourth electrode. A projection of the first protruding part of the third electrode on a side surface of the first active part is partially overlapped with a projection of the first protruding part of the fourth electrode on the side surface of the first active part.

In some embodiments, each of the plurality of driving elements further includes a switching transistor disposed on a side of the driving transistor away from the substrate. The switching transistor includes a second active part, a second gate electrode, a fifth electrode, and a sixth electrode. The fifth electrode and the sixth electrode are located on a side of the second active part away from the substrate.

In some embodiments, the fifth electrode and the sixth electrode are spaced apart from each other and disposed on two opposite sides of the second active part along the first direction, respectively. At least one of the fifth electrode and the sixth electrode is provided with a second protruding part, and the second protruding part extends to two opposite sides of the second active part along the second direction perpendicular to the first direction, and is configured to block light reflected by the third electrode and the fourth electrode from irradiating the second active part.

In some embodiments, the first gate electrode is located on the side of the first active part away from the substrate, and the second gate electrode is located on the side of the second active part close to the substrate.

In some embodiments, the display panel further includes a light absorbing layer disposed on a surface of each second active part close to the substrate.

In some embodiments, the substrate is made of a transparent material.

In some embodiments, the light emitting element is a micro light emitting diode configured to emit first light rays.

In some embodiments, an area between a surface of the quantum dot layer close to the substrate and the substrate is made of a transparent material.

In some embodiments, the quantum dot layer includes a red quantum dot layer, a green quantum dot layer, and a transparent quantum dot layer: and the quantum dot layer is configured to make the first light rays pass through the quantum dot layer to emit second light rays.

In some embodiments, the first light rays are blue light, and the second light rays include red light, green light, or blue light.

In some embodiments, the driving transistor has a top-gate structure.

In some embodiments, the switching transistor has a bottom-gate structure.

In some embodiments, the first protruding part is disposed on one side of the third electrode and/or the fourth electrode along the second direction.

Another technical solution adopted by the present disclosure is providing a method for making the display panel. The method for making the display panel includes forming a driver circuit layer on a substrate, and disposing a light emitting unit layer on a side of the driving circuit layer away from the substrate.

The driving circuit layer includes a plurality of driving elements, a plurality of common electrodes, and a plurality of signal lines.

The light emitting unit layer includes a plurality of light emitting units and a black matrix layer.

The plurality of light emitting units is disposed in an array, and each of the plurality of light emitting units includes a quantum dot layer and a light emitting element. The light emitting element includes a light emitting layer, a first electrode, and a second electrode. The plurality of light emitting units is staggered with the plurality of driving elements, the plurality of common electrodes, and the plurality of signal lines. The light emitting element is located on a side of the quantum dot layer away from the substrate. The first electrode and the second electrode are located on a side of the light emitting layer away from the substrate, and the light emitting element is configured to emit light towards the quantum dot layer to excite the quantum dot layer to emit light. The black matrix layer is located between adjacent two of the plurality of light emitting units. The black matrix layer defines a plurality of first through holes and a plurality of second through holes. Each of the plurality of first through holes extends to the driving circuit layer to expose a corresponding one of the plurality of driving elements, and each of the plurality of second through holes extends to the driving circuit layer to expose a corresponding one of the plurality of common electrodes. The first electrode is electrically connected to the corresponding one of the plurality of driving elements through a corresponding one of the plurality of first through holes, and the second electrode is electrically connected to the corresponding one of the plurality of common electrodes through a corresponding one of the plurality of second through holes.

In some embodiments, each of the plurality of driving elements includes a driving transistor, the driving transistor at least includes a first active part, a first gate electrode, a third electrode, and a fourth electrode; the third electrode and the fourth electrode are spaced apart from each other and disposed on two opposite sides of the first active part along a first direction; and a first protruding part is disposed on each of two opposite ends of each of the third electrode and the fourth electrode along a second direction perpendicular to the first direction.

In some embodiments, each of the plurality of driving elements includes a switching transistor, and the switching transistor includes a second active part, a second gate electrode, a fifth electrode, and a sixth electrode; the fifth electrode and the sixth electrode are spaced apart from each other and disposed on two opposite sides of the second active part along a first direction; and a second protruding part is disposed on each of two opposite ends of each of the fifth electrode and the sixth electrode along a second direction perpendicular to the first direction.

BRIEF DESCRIPTION OF THE DRAWINGS

In order to more clearly illustrate the technical solutions in some embodiments of the present disclosure or in the related art, hereinafter, a brief introduction will be given to the accompanying drawings that are used in the description of some embodiments or the related art.

Obviously, the accompanying drawings in the description below are merely some embodiments of the present disclosure. For those of ordinary skill in the art, other accompanying drawings may be obtained based on these accompanying drawings without any creative efforts.

FIG. 9 is a structural schematic view of a display panel in a sixth embodiment provided by the present disclosure.

FIG. 10 is a flow chart of a method for making the display panel provided by the present disclosure.

Figure 1:
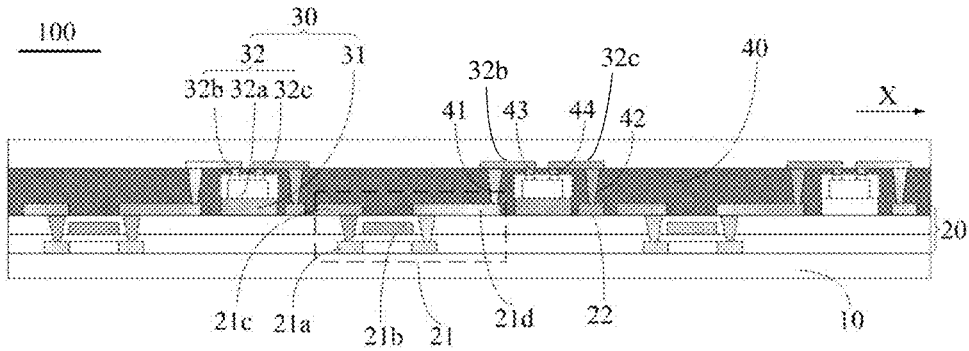
FIG. 1 is a structural schematic view of a display panel in a first embodiment provided by the present disclosure.

Explanation of the attached drawing labels: 100, 200, 300, 400, 500, 600—display panel, 10—substrate, 20—driving circuit layer, 30—light emitting unit, 40—black matrix layer, 50—planarization layer, 60—first covering layer, 70—light absorbing layer, 21—driving element, 22—common electrode, 21*a*—first active part, 21*b*—first gate electrode, 21*c*—third electrode, 21*d*—fourth electrode, 21*e*—first protruding part, 23—switching transistor layer, 231—switching transistor, 231*a*—second active part, 231*b*—second gate electrode, 231*c*—fifth electrode, 231*d*—sixth electrode, 231*e*—second protruding part, 31—quantum dot layer, 32—light emitting element, 32*a*—light emitting layer, 32*b*—first electrode, 32*c*—second electrode, 41—first through hole, 42—second through hole, 43—third through hole, 44—fourth through hole, 61—fifth through hole, 62—sixth through hole.

DETAILED DESCRIPTION

The technical solutions in some embodiments of the present disclosure may be clearly and completely described in conjunction with accompanying drawings in some embodiments of the present disclosure. Obviously, the described embodiments are only a part of the embodiments of the present disclosure, and not all embodiments. Based on the embodiments in the present disclosure, all other embodiments obtained by those of ordinary skill in the art without creative effort are within the scope of the present disclosure.

The terms "first", "second", and "third" in the present disclosure are only configured to describe purposes and cannot be understood as indicating or implying relative importance or implicit indicating the quantity of technical features indicated. Therefore, features limited to "first". "second", and "third" may explicitly or implicitly include at least one of these features. In the description of the present disclosure, "multiple" means at least two, such as two, three, etc., unless otherwise expressly and specifically qualified. All directional indications (such as up, down, left, right, front, rear, or the like) in some embodiments of the present disclosure are only configured to explain a relative position relationship between components in a specific posture (as shown in the accompanying drawings), a motion situation between the components in the specific posture (as shown in the accompanying drawings), or the like. If the specific posture is changed, the directional indication is also changed accordingly. In addition, the terms "including", "comprising", and "having", as well as any variations of the terms "including", "comprising", and "having", are intended to cover non-exclusive inclusions. For example, a process, method, system, product, or device that includes a series of operations or units is not limited to the listed operations or units, but optionally includes operations or units that are not listed, or optionally includes other operations or units that are inherent to these processes, methods, products, or devices.

The reference to "embodiments" in the present disclosure means that, specific features, structures, or characteristics described in conjunction with some embodiments may be included in at least one embodiment of the present disclosure. The phrase appearing in various positions in the specification does not necessarily refer to the same embodiment, nor is it an independent or alternative embodiment that is mutually exclusive with other embodiments. Those of ordinary skill in the art explicitly and implicitly understand that the embodiments described in the present disclosure can be combined with other embodiments.

The present disclosure mainly solves the technical problem of full-color display of an inorganic micro light emitting diode display.

The present disclosure may be explained in detail by combining the accompanying drawings and some embodiments.

Figure 2:
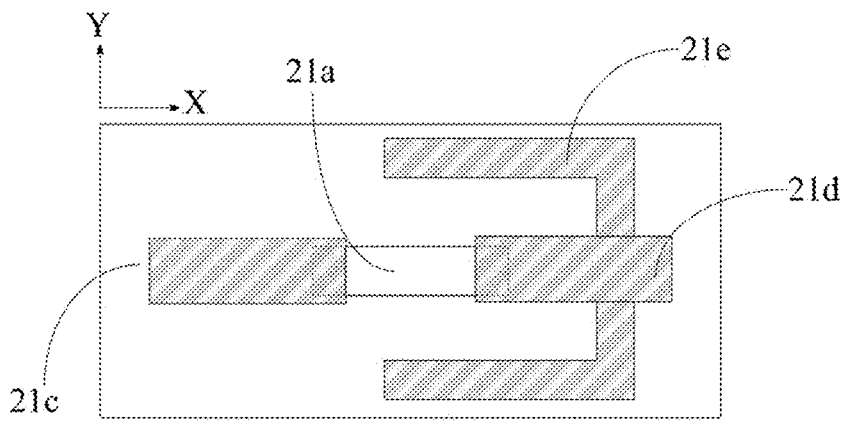
FIG. 2 is a structural schematic view of a first embodiment of a driving transistor of the display panel shown in FIG. 1.
Figure 3:
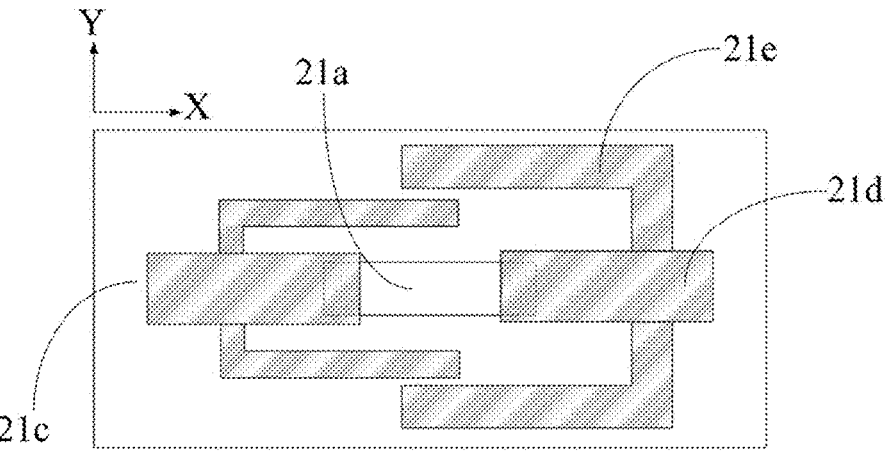
FIG. 3 is a structural schematic view of a second embodiment of the driving transistor of the display panel shown in FIG. 1.

Referring to FIGS. 1-3, FIG. 1 is a structural schematic view of a display panel 100 in a first embodiment provided by the present disclosure. FIG. 2 is a structural schematic view of a first embodiment of a driving transistor of the display panel 100 shown in FIG. 1. FIG. 3 is a structural schematic view of a second embodiment of the driving transistor of the display panel 100 shown in FIG. 1.

Referring to FIG. 1, the display panel 100 provided by some embodiments of the present disclosure includes a substrate 10, a driving circuit layer 20, a plurality of light emitting units 30, and a black matrix layer 40. The driving circuit layer 20 is disposed on a side of the substrate 10, and the driving circuit layer 20 is in direct contact with the substrate 10. The driving circuit layer 20 includes a plurality of driving elements 21, a plurality of common electrodes 22, and a plurality of signal lines (not shown in figures). The plurality of light emitting units 30 are disposed in an array, and the plurality of light emitting units 30 are disposed on a side of the driving circuit layer 20 away from the substrate 10. Each light emitting unit 30 includes a quantum dot layer 31 and a light emitting element 32. Each light emitting element 32 includes a light emitting layer 32*a*, a first electrode 32*b*, and a second electrode 32*c*. The black matrix layer 40 is disposed on a side of the driving circuit layer 20 away from the substrate 10, and the black matrix layer 40 is located between two adjacent light emitting units 30. Further, in some embodiments of the present disclosure, the plurality of light emitting units 30 are staggered with or misaligned with the plurality of driving elements 21, the plurality of common electrodes 22, and the plurality of signal lines (not shown in figures), to facilitate the plurality of light emitting units 30 to emit light towards the side of the substrate 10. The driving circuit layer 20 does not shield the light emitted by the plurality of light emitting units 30, and does not have other impacts on the plurality of light emitting units 30. In some embodiments, the light emitting element 32 adopts a micro light emitting diode (Micro LED), and the Micro LED is configured to emit first light rays. In some embodiments, the first electrode 32*b* of the Micro LED is electrically connected to a corresponding one of the driving elements 21, and the second electrode 32*c* of the Micro LED is electrically connected to a corresponding one of the common electrodes 22. In order to ensure that the plurality of light emitting elements 32 in the display panel 100 of some embodiments of the present disclosure emit light towards the substrate 10 and ensure a light emitting efficiency, in some embodiments, an area between a surface of the quantum dot layer 31 close to the substrate 10 and the substrates 10 may include or be made of transparent material. The substrate 10 may also include or be made of transparent material.

In some embodiments, the quantum dot layer 31 includes a red quantum dot layer, a green quantum dot layer, and a transparent quantum dot layer. The quantum dot layer 31 is configured to allow the first light rays to pass therethrough to emit second light rays. In some embodiments, the first light rays adopt blue light, and the second light ray includes red light, green light, or the blue light. The arrangement of the display panel 100 in some embodiments of the present disclosure achieves full-color display of the display panel 100.

In some embodiments, the light emitting element 32 is located on a side of the quantum dot layer 31 away from the substrate 10, so that the light emitting element 32 in some embodiments of the present disclosure emits light towards the side of the substrate 10. The first electrode 32b and the second electrode 32c of the light emitting element 32 in some embodiments of the present disclosure are located on a side of the light emitting layer 32a away from the substrate 10, so that the light emitting element 32 may emit light towards the quantum dot layer 31, thereby exciting the quantum dot layer 31 to emit light. Further, the black matrix layer 40 of some embodiments of the present disclosure defines a plurality of first through holes 41 and a plurality of second through holes 42. Each first through hole 41 extends to the driving circuit layer 20 to expose the corresponding one of the driving elements 21, and each second through hole 42 extends to the driving circuit layer 20 to expose the corresponding one of the common electrodes 22. In some embodiments, the first electrode 32b of the light emitting element 32 is electrically connected to the corresponding one of the driving elements 21 through a corresponding one of the first through holes 41, and the second electrode 32c is electrically connected to the corresponding one of the common electrodes 22 through a corresponding one of the second through holes 42.

In related arts, a driving circuit is electrically connected to a light emitting element and a pixel circuit through defining a via hole on a planarization layer. According to actual needs, the planarization layer requires a greater thickness. A depth of the via hole defined in the planarization layer is relatively deep, it is difficult to effectively deposit conductive substance in the via hole, which may result in too large deposition thickness of the conductive substance and cause a short circuit between electrodes. In related arts, the planarization layer is usually made of an inorganic insulation material, which makes the deposition of inorganic insulation material in the display panel 100 more difficult, further increasing the deposition difficulty of the planarization layer. When disposing the Micro LED or other light emitting elements on the planarization layer, a groove needs to be defined in the planarization layer, further increasing the difficulty of the process.

In some embodiments, the black matrix layer 40 and the light emitting units 30 are directly disposed on a surface of the driving circuit layer 20 away from the substrate 10. That is, the black matrix layer 40 is in direct contact with the driving circuit layer 20, and the light emitting unit 30 is in direct contact with the driving circuit layer 20, greatly simplifying the preparation process of the display panel 100 and reducing the process difficulty of the display panel 100. The black matrix layer 40 not only ensures the shading effect, but also serves as the planarization layer. Compared with the related art, in some embodiments of the present disclosure, the black matrix layer 40 and the light emitting unit 30 are directly disposed on the surface of the driving circuit layer 20 away from the substrate 10, and the first through holes 41 and the second through holes 42 are defined in the black matrix layer 40 and configured to electrically connect the light emitting elements 32 and the driving circuit layer 20, thereby reducing the difficulty of preparing the planarization layer or reducing the thickness of the planarization layer. Furthermore, a thickness of each first through hole 41 and a thickness of each second through hole 42 of the black matrix layer 40 of some embodiments of the present disclosure are moderate or appropriate, and the problems of excessive deposition of conductive substances or the like do not occur. In some embodiments of the present disclosure, the black matrix layer 40 is disposed, it is no need to define the groove on the surface of the black matrix layer 40 away from the substrate 10, and the light emitting unit 30 may be directly disposed in the through holes in the black matrix layer 40, which reduces the process difficulty.

Further, the thickness of the black matrix layer 40 of some embodiments is greater than that of each of the light emitting units 30, and the black matrix layer 40 is configured to cover the light emitting units 30. Moreover, the black matrix layer 40 of some embodiments defines a plurality of third through holes 43 and a plurality of fourth through holes 44. Each third through hole 43 is configured to expose the first electrode 32b of the light emitting element 32, and each fourth through hole 44 is configured to expose the second electrode 32c of the light emitting element 32.

In some embodiments, each driving element 21 in some embodiments is a driving transistor disposed on the side of the substrate 10. The driving element 21 at least includes a first active part 21a, a first gate electrode 21b, a third electrode 21c, and a fourth electrode 21d. The third electrode 21c and the fourth electrode 21d are disposed on a side of the first active part 21a away from the substrate 10. The third electrode 21c and the fourth electrode 21d are spaced apart from each other and disposed on two opposite sides of the first active part 21a along a X direction. In some embodiments, at least one of the third electrode 21c and the fourth electrode 21d is provided with a first protruding part 21e. That is, the third electrode 21c is provided with the first protruding part 21e, and the fourth electrode 21d is not provided with the first protruding part 21e. Alternatively, the third electrode 21c is not provided with the first protruding part 21e, and the fourth electrode 21d is provided with the first protruding part 21e. Alternatively, the third electrode 21c is provided with the first protruding part 21e, and the fourth electrode 21d is provided with the first protruding part 21e. The first protruding part 21e extends to two opposite sides of the first active part 21a along a second direction Y that is perpendicular to the first direction X. The first protruding part 21e is configured to block the light emitted by the light emitting element 32 from irradiating the first active part 21a.

Referring to FIG. 2, in some embodiments, only each of two opposite sides of the fourth electrode 21d of the driving transistor along the second direction Y is provided with the first protruding part 21e, so that the fourth electrode 21d having two first protruding parts 21e has a certain blocking effect on the light emitted by the light emitting element 32 towards the substrate 10. The fourth electrode 21d having the two first protruding parts 21e also has a certain blocking effect on the first active part 21a. That is, the light emitted by the light emitting element 32 towards the first active part 21a is blocked by the fourth electrode 21d having the two first protruding parts 21e. In some embodiments, only each of two opposite sides of the third electrode 21c of the driving transistor along the second direction Y is provided with the first protruding part 21e, so that the light emitted by the light emitting element 32 towards the substrate 10 is blocked, and the light emitted by the light emitting element 32 towards the first active part 21a is also blocked. In some embodiments, the first protruding part 21e may be disposed on one side of the third electrode 21c and/or the fourth electrode 21d along the second direction Y. That is, one side of the third electrode 21c along the second direction Y is provided with the first protruding part 21e, and one side of the fourth electrode 21d along the second direction Y is not provided with the first protruding part 21e. Alternatively, one side of the third electrode 21c along the second direction Y is not provided with the first protruding part 21e, and one side of the fourth electrode 21d along the second direction Y is provided with the first protruding part 21e. Alternatively, one side of the third electrode 21c along the second direction Y is provided with the first protruding part 21e, and one side of the fourth electrode 21d along the second direction Y is provided with the first protruding part 21e.

Referring to FIG. 3, in some embodiments, each of the third electrode 21c and the fourth electrode 21d of the driving transistor is provided with the first protruding part 21e, which effectively blocks the light emitted by the light emitting element 32 towards the substrate 10, and effectively blocks the light from irradiating the first active part 21a. In some embodiments, the first protruding part 21e of the third electrode 21c is staggered with or misaligned with the first protruding part 21e of the fourth electrode 21d. A projection of the first protruding part 21e of the third electrode 21c on a side surface of the first active part 21a is partially overlapped with a projection of the first protruding part 21e of the fourth electrode 21d on the side surface of the first active part 21a, so as to form an omnidirectional light shielding for the first active part 21a.

Figure 4:
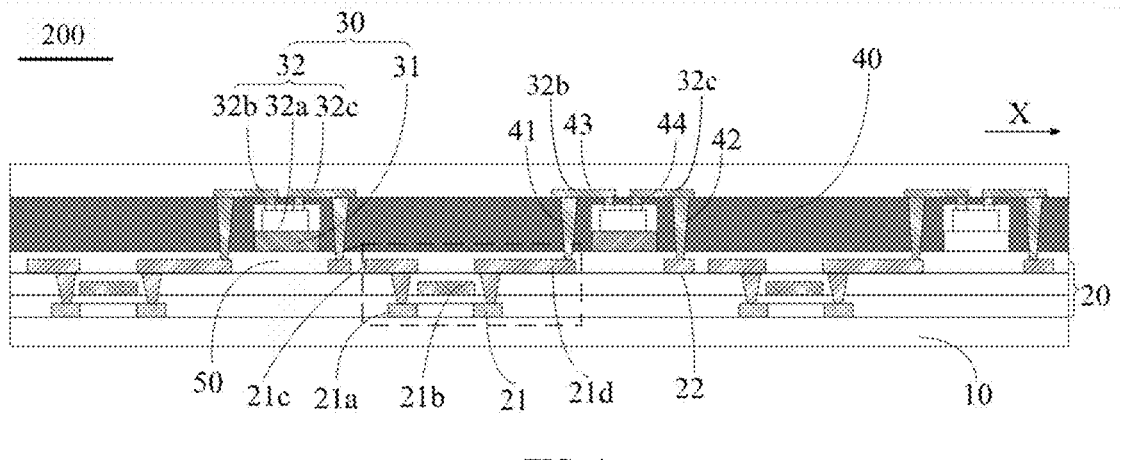
FIG. 4 is a structural schematic view of a display panel in a second embodiment provided by the present disclosure.

Referring to FIG. 4, FIG. 4 is a structural schematic view of a display panel 200 in a second embodiment provided by the present disclosure.

Referring to FIG. 4, the display panel 200 provided by the second embodiment is different from the display panel 100 provided by the first embodiment in that: the display panel 200 of the second embodiment further includes a planarization layer 50 disposed on the side of the driving circuit layer 20 away from the substrate 10, and the black matrix layer 40 and the light emitting unit 30 are disposed on a surface of the planarization layer 50 away from the substrate 10. In the second embodiment, the planarization layer 50 is disposed on the surface of the driving circuit layer 20 away from the substrate 10, which facilitates improving the surface flatness of the driving circuit layer 20, thereby facilitating disposing the black matrix layer 40 and the light emitting unit 30 on the surface of the planarization layer 50 away from the substrate 10.

Figure 5:
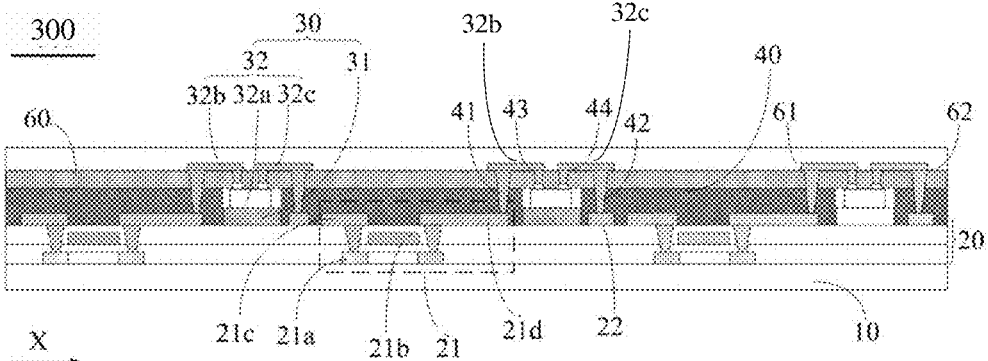
FIG. 5 is a structural schematic view of a display panel in a third embodiment provided by the present disclosure.

Referring to FIG. 5, FIG. 5 is a structural schematic view of a display panel 300 in a third embodiment provided by the present disclosure.

Referring to FIG. 5, the display panel 300 provided by the third embodiment is different from the display panel 100 provided by the first embodiment in that: in the display panel 300 of the third embodiment, the thickness of the black matrix layer 40 is less than or equal to the thickness of the light emitting unit 30. In order to make the black matrix layer 40 and the light emitting unit 30 to be at the same level, the display panel 300 of the third embodiment further includes a first covering layer 60. The first covering layer 60 is configured to cover the black matrix layer 40 and the light emitting unit 30. The first covering layer 60 defines a plurality of fifth through holes 61 and a plurality of sixth through holes 62. Each fifth through hole 61 is configured to expose the first electrode 32b of the light emitting element 32, and each sixth through hole 62 is configured to expose the second electrode 32c of the light emitting element 32. The first covering layer 60 may be configured to protect the first electrode 32b and the second electrode 32c of the light emitting element 32. Each of the fifth through holes 61 and the sixth through holes 62 extends through the first covering layer 60 along a thickness direction of the first covering layer 60 or the second direction Y. In some embodiments, the display panel 300 is provided with the planarization layer 50 on the surface of the driving circuit layer 20 away from the substrate 10, and the first covering layer 60 is also disposed on the surface of the black matrix layer 40 and the surface of the light emitting unit 30 away from the substrate 10. Therefore, the display panel 300 has good flatness on the surface of the driving circuit layer 20 away from the substrate 10, and the first electrode 32b and the second electrode 32c of the light emitting element 32 are also well protected.

Figure 6:
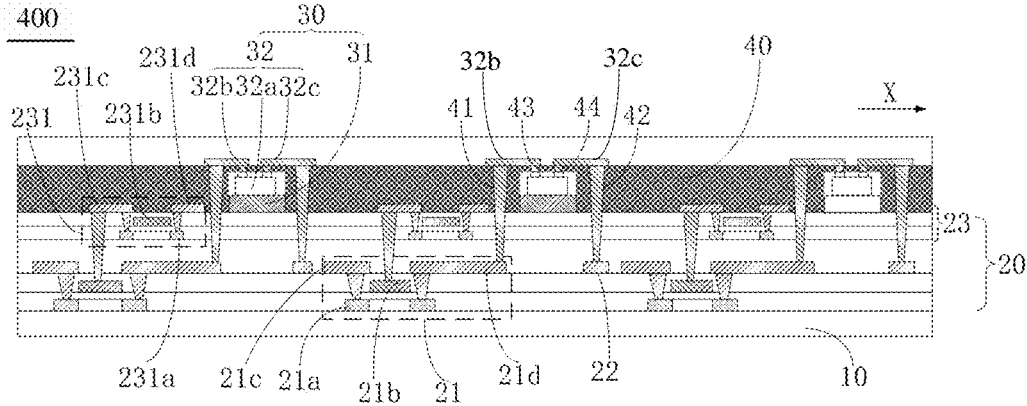
FIG. 6 is a structural schematic view of a display panel in a fourth embodiment provided by the present disclosure.
Figure 7:
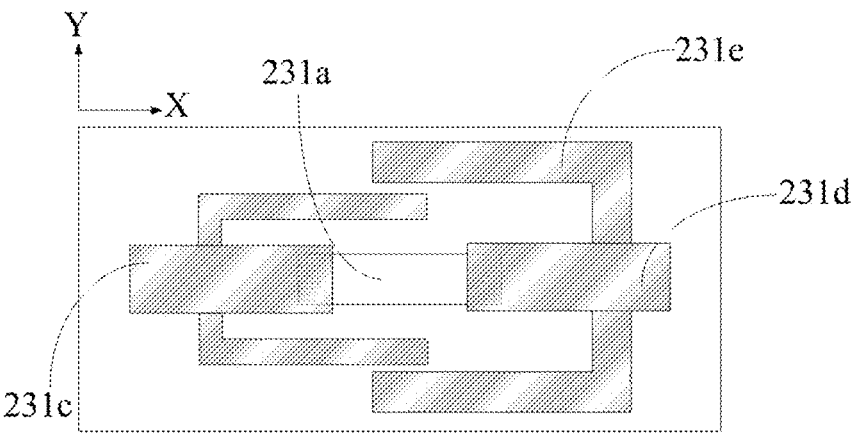
FIG. 7 is a structural schematic view of a switching transistor of the display panel shown in FIG. 6.

Referring to FIGS. 6 and 7, FIG. 6 is a structural schematic view of a display panel 400 in a fourth embodiment provided by the present disclosure. FIG. 7 is a structural schematic view of a switching transistor of the display panel 400 shown in FIG. 6.

Referring to FIG. 6, the display panel 400 provided by the fourth embodiment is different from the display panel 100 provided by the first embodiment in that: the driving circuit layer 20 in the display panel 400 of the fourth embodiment further includes a switching transistor layer 23. The switching transistor layer 23 is disposed on a side of the driving transistor away from the substrate 10, and the switching transistor layer 23 includes a plurality of switching transistors 231. In some embodiments, each switching transistor 231 includes a second active part 231a, a second gate electrode 231b, a fifth electrode 231c, and a sixth electrode 231d. The fifth electrode 231c and the sixth electrode 231d are located on a side of the second active part 231a away from the substrate 10. In some embodiments, the fifth electrode 231c of the switching transistor 231 is electrically connected to the first gate electrode 21b of the driving transistor, which is configured to control the turn-on or turn-off of the drive transistor. In some embodiments, the sixth electrode 231d of the switching transistor 231 is electrically connected to scanning signal lines, the fifth electrode 231c of the switching transistor 231 is electrically connected to the first gate electrode 21b of the driving transistor, the third electrode 21c of the driving transistor is electrically connected to data signal lines, and the fourth electrode 21d of the driving transistor is electrically connected to the first electrode 32b of the light emitting element 32.

Referring to FIG. 7, in some embodiments, the fifth electrode 231c and the sixth electrode 231d of the switching transistor 231 are spaced apart from each other and disposed on two opposite sides of the second active part 231a along the first direction X. The fifth electrode 231c and/or the sixth electrode 231d are/is provided with a second protruding part 231e. That is, the fifth electrode 231c is provided with the second protruding part 231e, and the sixth electrode 231d is not provided with the second protruding part 231e. Alternatively, the fifth electrode 231c is not provided with the second protruding part 231e, and the sixth electrode 231d is provided with the second protruding part 231e. Alternatively, the fifth electrode 231c is provided with the second protruding part 231e, and the sixth electrode 231d is provided with the second protruding part 231e. The second protruding part 231e extends to two opposite sides of the second active part 231a along the second direction Y that is perpendicular to the first direction X, to block the light reflected by the third electrode 21c and the fourth electrode 21d of the driving transistor from irradiating the second active part 231a. In some embodiments, each of the fifth electrode 231c and the sixth electrode 231d is provided with the second protruding part 231e, which effectively blocks the light reflected by the third electrode 21c and the fourth electrode 21d of the driving transistor from irradiating the second active part 231a. In some embodiments, the second protruding part 231e of the fifth electrode 231c is staggered or misaligned with the second protruding part 231e of the sixth electrode 231d. A projection of the second protruding part 231e of the fifth electrode 231c on a side surface of the second active part 231a is partially overlapped with a projection of the second protruding part 231e of the sixth electrode 231d on the side surface of the second active part 231a, so as to form an omnidirectional light shielding for the second active part 231a.

Figure 8:
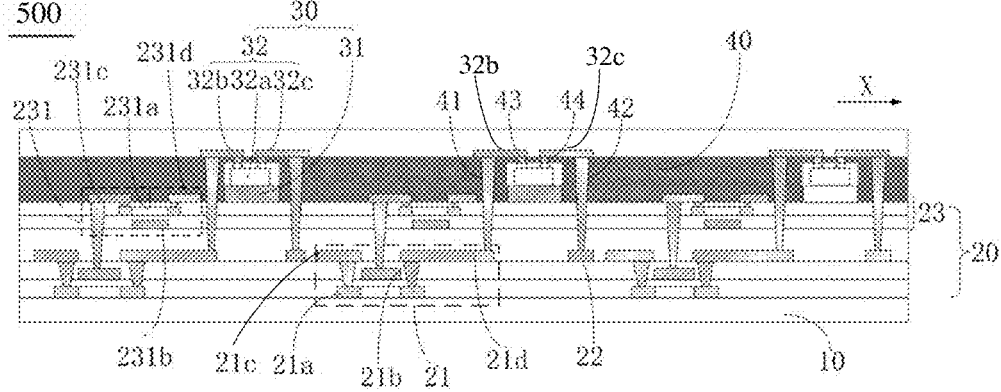
FIG. 8 is a structural schematic view of a display panel in a fifth embodiment provided by the present disclosure.

Referring to FIG. 8, FIG. 8 is a structural schematic view of a display panel 500 in a fifth embodiment provided by the present disclosure.

Referring to FIG. 8, the display panel 500 of the fifth embodiment is different from the display panel 400 of the fourth embodiment in that: in the display panel 500 of the fifth embodiment, the driving transistor adopts a top-gate structure, and the first gate electrode 21b of the driving transistor is located on the side of the first active part 21a away from the substrate 10. The switching transistor 231 has a bottom-gate structure, and the second gate electrode 231b of the switching transistor 231 is located on a side of the second active part 231a close to the substrate 10. In this arrangement, the second gate electrode 231b is configured to serve as a shielding layer for the second active part 231a, to improve the light shielding degree for the second active part 231a.

Referring to FIG. 9, FIG. 9 is a structural schematic view of a display panel 600 in a sixth embodiment provided by the present disclosure.

Referring to FIG. 9, the display panel 600 provided in the sixth embodiment is different from the display panel 400 provided in the fourth embodiment in that: the display panel 600 of the sixth embodiment further includes a light absorbing layer 70. The light absorbing layer 70 is disposed on a surface of the second active part 231a of each switching transistor 231 close to the substrate 10. The light absorbing layer 70 is configured to further block the light reflected by the third electrode 21c and the fourth electrode 21d of the driving transistor from irradiating the second active part 231a.

Referring to FIG. 10, FIG. 10 is a flow chart of a method for making the display panel 100, 200, 300, 400, 500, or 600 provided by the present disclosure.

Referring to 10, a method for making the display panel 100, 200, 300, 400, 500, or 600 provided by some embodiments of the present disclosure includes the following operations.

In an operation S1: forming the driving circuit layer 20 on the substrate 10. In some embodiments, the driving circuit layer 20 includes the plurality of driving elements 21, the plurality of common electrodes 22, and the plurality of signal lines.

In an operation S2: disposing a light emitting unit layer on the side of the driving circuit layer 20 away from the substrate 10. In some embodiments, the light emitting unit layer includes the plurality of light emitting units 30 disposed in an array, and the black matrix layer 40; the black matrix layer 40 is located between two adjacent light emitting units 30; each of the plurality of light emitting units 30 includes the quantum dot layer 31 and the light emitting element 32, and the light emitting element 32 includes the light emitting layer 32a, the first electrode 32b, and the second electrode 32c; and the plurality of light emitting units 30 are staggered or misaligned with the plurality of driving elements 21, the plurality of common electrodes 22, and the plurality of signal lines.

The light emitting element 32 is located on the side of the quantum dot layer 31 away from the substrate 10. The first electrode 32b and the second electrode 32c are located on the side of the light emitting layer 32a away from the substrate 10, so that the light emitting element 32 is configured to emit the light towards the quantum dot layer 31, thereby exciting the quantum dot layer 31 to emit light. The black matrix layer 40 defines the plurality of first through holes 41 and the plurality of second through holes 42. Each first through hole 41 extends to the driving circuit layer 20 to expose the corresponding one of the driving elements 21, and each second through hole 42 extends to the driving circuit layer 20 to expose the corresponding one of the common electrodes 22. The first electrode 32b is electrically connected to the corresponding one of the driving elements 21 through the corresponding one of the first through holes 41, and the second electrode 32c is electrically connected to the corresponding one of the common electrodes 22 through the corresponding one of the second through holes 42.

In some embodiments, the black matrix layer 40 is disposed through at least two implementation modes.

A first implementation mode for disposing the black matrix layer 40 includes following operations:

disposing the plurality of light emitting units 30 in an array on the surface of the driving circuit layer 20 or the first covering layer 60 away from the substrate 10;

defining a plurality of through holes in a matrix in the black matrix layer 40, and the plurality of through holes being in one-to-one correspondence with the plurality of light emitting units 30; and transferring the black matrix layer 40 with the plurality of through holes to the side of the plurality of light emitting units 30 in an array away from the substrate 10, and combining the black matrix layer 40 with the plurality of light emitting units 30.

A second implementation mode for disposing the black matrix layer 40 includes following operations:

disposing the black matrix layer 40 including the plurality of through holes on the surface of the driving circuit layer 20 or the first covering layer 60 away from the substrate 10; and disposing a plurality of quantum dot layers 31 in the plurality of through holes of the black matrix layer 40, and disposing the plurality of light emitting elements 32 on the surface of the plurality of quantum dot layers 31 away from the substrate 10; in some embodiments, the plurality of quantum dot layers 31 are in one-to-one correspondence with the plurality of through holes of the black matrix layer 40, and the plurality of light emitting elements 32 are in one-to-one correspondence with the plurality of quantum dot layers 31.

The effects of the present disclosure are as follows. In the display panel and the method for making the display panel provided by some embodiments of the present disclosure, the display panel includes the substrate, the driving circuit layer, the plurality of light emitting units, and the black matrix layer. The driving circuit layer includes the plurality of driving elements, the plurality of common electrodes, and the plurality of signal lines. Each of the plurality of light emitting units includes a quantum dot layer and a light emitting element. The light emitting element includes a light emitting layer, a first electrode, and a second electrode. The black matrix layer is located between two adjacent light emitting units. The plurality of light emitting units are staggered with the plurality of driving elements, the plurality of common electrodes, and the plurality of signal lines. The light emitting element is located on the side of the quantum dot layer away from the substrate. The first electrode and the second electrode are located on the side of the light emitting layer away from the substrate, so that the light emitting element emits light towards the quantum dot layer, thereby exciting the quantum dot layer to emit light. The black matrix layer defines the plurality of first through holes and the plurality of second through holes. Each first through hole extends to the driving circuit layer to expose a corresponding one of the plurality of driving elements, and each second through hole extends to the driving circuit layer to expose a corresponding one of the plurality of common electrodes. The first electrode is electrically connected to the corresponding one of the plurality of driving elements through a corresponding one of the plurality of first through holes, and the second electrode is electrically connected to the corresponding one of the plurality of common electrodes through a corresponding one of the plurality of second through holes. The embodiments of the present disclosure provide a full-color display panel emitting light towards the substrate, and improve electrodes of the driving transistor and/or electrodes of the switching transistor. When the plurality of light emitting units emits light towards the substrate, improved electrodes of the driving transistor and/or improved electrodes of the switching transistor may block light rays from irradiating the active part of the driving transistor and/or the active part of the switching transistor, thereby improving the extraction efficiency of the display panel provided in some embodiments of the present disclosure, and reducing the influence of the light rays on devices on the display panel.

In some embodiments of the present disclosure, the disclosed systems, devices, and methods may be implemented in other ways. For example, the device embodiments described above are only illustrative. For example, the division of units is only a logical function division. In actual implementation, there may be another division mode. For example, multiple units or components can be combined or integrated into another system, some features can be ignored, or some operations cannot be executed. On the other hand, the illustrated or discussed coupling, direct coupling, or communication connection may be achieved through some interfaces. The devices or units can be indirectly coupled or connected through electrical, mechanical, or other forms.

In addition, the functional units in some embodiments of the present disclosure may be integrated into one processing unit, or each unit may be physically independent, or two or more units may be integrated into one unit. The integrated unit may be implemented in a form of hardware, or may be implemented in a form of a software functional unit.

The above description is only some embodiments of the present disclosure, and is not intended to limit the scope of the present disclosure. Any equivalent structure or equivalent flow transformation made by using the contents of the specification and accompanying drawings of the present disclosure, or directly or indirectly applied to other related technical fields, is included in the scope of the patent protection of the present disclosure.

What is claimed is:

1. A display panel, comprising:
a substrate;
a driving circuit layer disposed on a side of the substrate, wherein the driving circuit layer comprises a plurality of driving elements, a plurality of common electrodes, and a plurality of signal lines;

a plurality of light emitting units disposed in an array and on a side of the driving circuit layer away from the substrate, wherein each of the plurality of light emitting units comprises a quantum dot layer and a light emitting element, and the light emitting element comprises a light emitting layer, a first electrode, and a second electrode; and
a black matrix layer, disposed on the side of the driving circuit layer away from the substrate, and between adjacent two of the plurality of light emitting units;
wherein the plurality of light emitting units are staggered with the plurality of driving elements, the plurality of common electrodes, and the plurality of signal lines; the light emitting element is located on a side of the quantum dot layer away from the substrate; the first electrode and the second electrode are located on a side of the light emitting layer away from the substrate; the black matrix layer defines a plurality of first through holes and a plurality of second through holes, each of the plurality of first through holes extends to the driving circuit layer to expose a corresponding one of the plurality of driving elements, and each of the plurality of second through holes extends to the driving circuit layer to expose a corresponding one of the plurality of common electrodes; and the first electrode is electrically connected to the corresponding one of the plurality of driving elements through a corresponding one of the plurality of first through holes, and the second electrode is electrically connected to the corresponding one of the plurality of common electrodes through a corresponding one of the plurality of second through holes.

2. The display panel as claimed in claim 1, wherein the black matrix layer and the plurality of light emitting units are disposed on a surface of the driving circuit layer away from the substrate, and the driving circuit layer is in direct contact with the black matrix layer and the plurality of light emitting units; or
the display panel further comprises a planarization layer disposed on the side of the driving circuit layer away from the substrate, and the black matrix layer and the plurality of light emitting units are disposed on a surface of the planarization layer away from the substrate.

3. The display panel as claimed in claim 1, wherein a thickness of the black matrix layer is greater than a thickness of each of the plurality of light emitting units, the black matrix layer is configured to cover the plurality of light emitting units, and the black matrix layer further defines a plurality of third through holes and a plurality of fourth through holes, wherein each of the plurality of third through holes is configured to expose the first electrode of the light emitting element of a corresponding one of the plurality of light emitting units, and each of the plurality of fourth through holes is configured to expose the second electrode of the light emitting element of a corresponding one of the plurality of light emitting units; or
the thickness of the black matrix layer is less than or equal to the thickness of each of the plurality of light emitting units; the display panel further comprises a first covering layer, and the first covering layer is configured to cover the black matrix layer and the plurality of light emitting units; and the first covering layer defines a plurality of fifth through holes and a plurality of sixth through holes; each of the plurality of fifth through holes is configured to expose the first electrode of the light emitting element of a corresponding one of the plurality of light emitting units, and each of the plurality of sixth through holes is configured to expose the second electrode of the light emitting element of a corresponding one of the plurality of light emitting units, and the plurality of fifth through holes and the plurality of sixth through holes are configured to extend through the first covering layer.

4. The display panel as claimed in claim 1, wherein each of the plurality of driving elements comprises a driving transistor disposed on the side of the substrate;

the driving transistor at least comprises a first active part, a first gate electrode, a third electrode, and a fourth electrode; the third electrode and the fourth electrode are disposed on a side of the first active part away from the substrate, and the third electrode and the fourth electrode are spaced apart from each other and disposed on two opposite sides of the first active part along a first direction, respectively; and at least one of the third electrode and the fourth electrode is provided with a first protruding part, the first protruding part extends to two opposite sides of the first active part along a second direction perpendicular to the first direction.

5. The display panel as claimed in claim 4, wherein each of the third electrode and the fourth electrode is provided with the first protruding part, the first protruding part of the third electrode is staggered with the first protruding part of the fourth electrode, and a projection of the first protruding part of the third electrode on a side surface of the first active part is partially overlapped with a projection of the first protruding part of the fourth electrode on the side surface of the first active part.

6. The display panel as claimed in claim 4, wherein each of the plurality of driving elements further comprises a switching transistor disposed on a side of the driving transistor away from the substrate; the switching transistor comprises a second active part, a second gate electrode, a fifth electrode, and a sixth electrode; and the fifth electrode and the sixth electrode are located on a side of the second active part away from the substrate.

7. The display panel as claimed in claim 6, wherein the fifth electrode and the sixth electrode are spaced apart from each other and disposed on two opposite sides of the second active part along the first direction, respectively, at least one of the fifth electrode and the sixth electrode is provided with a second protruding part, the second protruding part extends to two opposite sides of the second active part along the second direction perpendicular to the first direction.

8. The display panel as claimed in claim 6, wherein the first gate electrode is located on the side of the first active part away from the substrate, and the second gate electrode is located on the side of the second active part close to the substrate.

9. The display panel as claimed in claim 6, further comprising a light absorbing layer disposed on a surface of the second active part of the switching transistor of each of the plurality of driving elements close to the substrate.

10. The display panel as claimed in claim 6, wherein the switching transistor has a bottom-gate structure.

11. The display panel as claimed in claim 4, wherein the driving transistor has a top-gate structure.

12. The display panel as claimed in claim 4, wherein the first protruding part is disposed on one side of the third electrode and/or the fourth electrode along the second direction.

13. The display panel as claimed in claim 1, wherein the substrate is made of a transparent material.

14. The display panel as claimed in claim 1, wherein the light emitting element is a micro light emitting diode configured to emit first light rays.

15. The display panel as claimed in claim 14, wherein the quantum dot layer comprises a red quantum dot layer, a green quantum dot layer, and a transparent quantum dot layer; and the quantum dot layer is configured to allow the first light rays to pass therethrough to emit second light rays.

16. The display panel as claimed in claim 15, wherein the first light rays are blue light, and the second light rays comprise red light, green light, or blue light.

17. The display panel as claimed in claim 1, wherein an area between a surface of the quantum dot layer close to the substrate and the substrate is made of a transparent material.

18. A method for making a display panel, comprising:

forming a driver circuit layer on a substrate, wherein the driving circuit layer comprises a plurality of driving elements, a plurality of common electrodes, and a plurality of signal lines; and disposing a light emitting unit layer on a side of the driving circuit layer away from the substrate, wherein the light emitting unit layer comprises:

a plurality of light emitting units disposed in an array, wherein each of the plurality of light emitting units comprises a quantum dot layer and a light emitting element; the light emitting element comprises a light emitting layer, a first electrode, and a second electrode; the plurality of light emitting units is staggered with the plurality of driving elements, the plurality of common electrodes, and the plurality of signal lines; the light emitting element is located on a side of the quantum dot layer away from the substrate; and the first electrode and the second electrode are located on a side of the light emitting layer away from the substrate, and the light emitting element is configured to emit light towards the quantum dot layer to excite the quantum dot layer to emit light; and a black matrix layer located between adjacent two of the plurality of light emitting units, wherein the black matrix layer defines a plurality of first through holes and a plurality of second through holes, each of the plurality of first through holes extends to the driving circuit layer to expose a corresponding one of the plurality of driving elements, and each of the plurality of second through holes extends to the driving circuit layer to expose a corresponding one of the plurality of common electrodes; and the first electrode is electrically connected to the corresponding one of the plurality of driving elements through a corresponding one of the plurality of first through holes, and the second electrode is electrically connected to the corresponding one of the plurality of common electrodes through a corresponding one of the plurality of second through holes.

19. The method as claimed in claim 18, wherein each of the plurality of driving elements comprises a driving transistor, the driving transistor at least comprises a first active part, a first gate electrode, a third electrode, and a fourth electrode; the third electrode and the fourth electrode are spaced apart from each other and disposed on two opposite sides of the first active part along a first direction; and a first protruding part is disposed on each of two opposite ends of each of the third electrode and the fourth electrode along a second direction perpendicular to the first direction.

20. The method as claimed in claim 18, wherein each of the plurality of driving elements comprises a switching transistor, and the switching transistor comprises a second active part, a second gate electrode, a fifth electrode, and a sixth electrode; the fifth electrode and the sixth electrode are spaced apart from each other and disposed on two opposite sides of the second active part along a first direction; and a second protruding part is disposed on each of two opposite ends of each of the fifth electrode and the sixth electrode along a second direction perpendicular to the first direction.

\* \* \* \* \*